(12) United States Patent
Yun et al.

(10) Patent No.: US 7,948,823 B2
(45) Date of Patent: May 24, 2011

(54) SEMICONDUCTOR MEMORY DEVICE AND WORD LINE DRIVING METHOD THEREOF

(75) Inventors: Tae-Sik Yun, Gyeonggi-do (KR); Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 319 days.

(21) Appl. No.: 12/344,629

(22) Filed: Dec. 29, 2008

(65) Prior Publication Data
US 2010/0061177 A1 Mar. 11, 2010

(30) Foreign Application Priority Data

Sep. 8, 2008 (KR) .................. 10-2008-0088324

(51) Int. Cl.
*G11C 8/00* (2006.01)
(52) U.S. Cl. .......... 365/230.06; 365/189.08; 365/185.23
(58) Field of Classification Search ............. 365/230.06, 365/189.08, 185.23
See application file for complete search history.

(56) References Cited

U.S. PATENT DOCUMENTS 6,603,701 B2 * 8/2003 Mizugaki et al. ........ 365/230.03
6,643,175 B2 * 11/2003 Yamauchi et al. ....... 365/185.11

FOREIGN PATENT DOCUMENTS

| KR | 1019960008823 B1 | 7/1996 |
|----|------------------|--------|
| KR | 1019980021468 A | 6/1998 |
| KR | 1019990081138 A | 11/1999 |
| KR | 1020010058893 A | 7/2001 |

OTHER PUBLICATIONS

Notice of Preliminary Rejection issued from Korean Intellectual Property Office on Dec. 9, 2009.
Notice of Allowance issued from Korean Intellectual Property Office on Jun. 3, 2010.

* cited by examiner

*Primary Examiner* — Son T Dinh
(74) *Attorney, Agent, or Firm* — IP & T Group LLP

(57) ABSTRACT

A semiconductor memory device having a plurality of cell blocks includes: a block decoding unit configured to decode an input address for selecting a corresponding cell block to generate a block selection signal; a block information address generating unit configured to perform a logic operation on the block selection signal and an assignment address for selecting a word line to be activated within the corresponding cell block to generate a block information address activated only when the corresponding cell block is selected; and a word line driving unit configured to select a word line in response to the block information address.

13 Claims, 15 Drawing Sheets

FIG. 2
(RELATED ART)

| X⟨11⟩ | X⟨10⟩ | X⟨9⟩ | X⟨8⟩ | X⟨7⟩ | MAT |
|---|---|---|---|---|---|
| 0<br>0<br>0 | 0<br>0<br>0 | 0<br>0<br>0 | 0<br>0<br>1 | 0<br>1<br>0 | 0 |
| 0<br>0<br>0 | 0<br>0<br>0 | 0<br>1<br>1 | 1<br>0<br>0 | 1<br>0<br>1 | 1 |
| 0<br>0<br>0 | 0<br>0<br>1 | 1<br>1<br>0 | 1<br>1<br>0 | 0<br>1<br>0 | 2 |
| 0<br>0<br>0 | 1<br>1<br>1 | 0<br>0<br>0 | 0<br>1<br>1 | 1<br>0<br>1 | 3 |
| 0<br>0<br>0 | 1<br>1<br>1 | 1<br>1<br>1 | 0<br>0<br>1 | 0<br>1<br>0 | 4 |
| 0<br>1<br>1 | 1<br>0<br>0 | 1<br>0<br>0 | 1<br>0<br>0 | 1<br>0<br>1 | 5 |
| 1<br>1<br>1 | 0<br>0<br>0 | 0<br>0<br>1 | 1<br>1<br>0 | 0<br>1<br>0 | 6 |
| 1<br>1<br>1 | 0<br>0<br>0 | 1<br>1<br>1 | 0<br>1<br>1 | 1<br>0<br>1 | 7 |
| 1<br>1<br>1 | 1<br>1<br>1 | 0<br>0<br>0 | 0<br>0<br>1 | 0<br>1<br>0 | 8 |
| 1<br>1<br>1 | 1<br>1<br>1 | 0<br>1<br>1 | 1<br>0<br>0 | 1<br>0<br>1 | 9 |
| 1<br>1 | 1<br>1 | 1<br>1 | 1<br>1 | 0<br>1 | 10 |

FIG. 3
(RELATED ART)
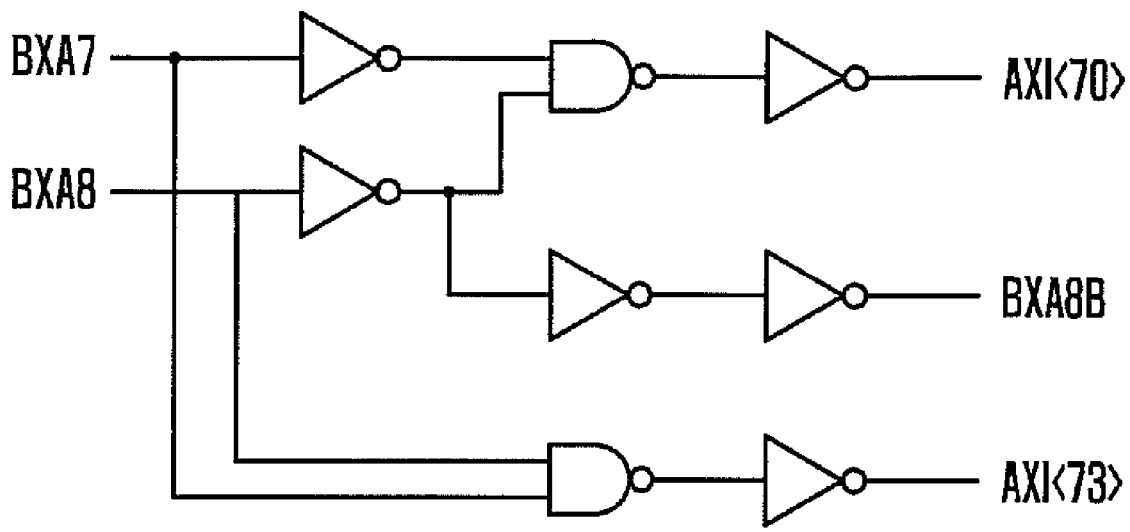
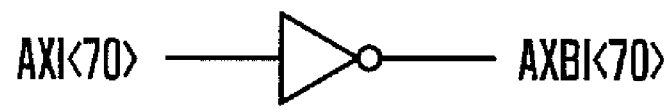
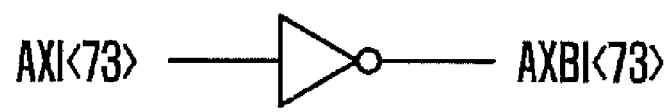

FIG. 7
(RELATED ART)
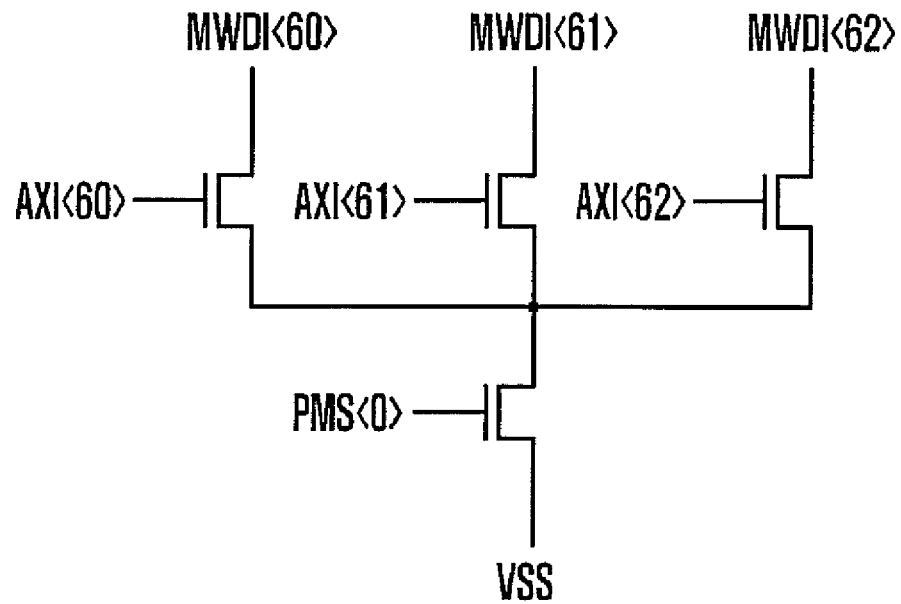
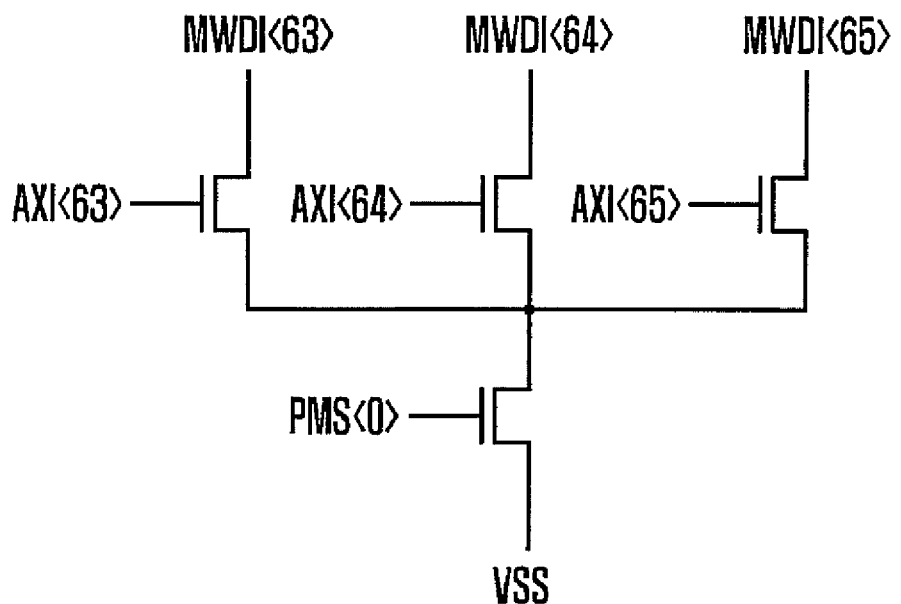

SEMICONDUCTOR MEMORY DEVICE AND WORD LINE DRIVING METHOD THEREOF

CROSS-REFERENCE TO RELATED APPLICATIONS

The present invention claims priority of Korean patent application number 10-2008-0088324, filed on Sep. 8, 2008, which is incorporated by reference in its entirety.

BACKGROUND OF THE INVENTION

The present invention relates to a semiconductor memory device, and more particularly, to a method for driving a word line by decoding an address.

A semiconductor memory device includes a plurality of cell blocks therein, and each of the cell blocks includes a plurality of memory cells. In a case where the number of word lines in each cell block is a power of 2, e.g., 256 or 512, it is relatively simple to select a word line to be driven according to an address. If the cell block includes 256 word lines, eight addresses are used to select the word line that corresponds to the address one-to-one; and if the cell block includes 512 word lines, nine addresses are used to select the word line that corresponds to the address one-to-one. However, a semiconductor memory device may be designed in a configuration that the number of word lines provided in each cell block is not a power of 2. For example, when the cell block includes 512 word lines, the efficiency in current consumption and timings may be degraded due to a large size of the cell block. However, when the cell block includes 256 word lines, the number of data stored in one cell block decreases, which leads to an increase in the total number of the cell blocks. Accordingly, the memory device is often designed in such a manner that the number of word lines is not a power of 2, for example, the number of word lines provided in each cell block is 384.

In this case, because the number of word lines to be selected in each of the cell blocks does not one-to-one correspond to the number of addresses, a procedure of selecting a word line becomes complicated. This will be described in detail below.

FIG. 1 is a block diagram of a conventional semiconductor memory device having a circuit configuration for selecting a word line by decoding an address.

As shown, the conventional semiconductor memory device includes eleven cell blocks 120 to 220 each of which is provided with 384 word lines, and a pre-decoder 110. That is, the total number of the word lines is 4,224. The pre-decoder 110 pre-decodes seventh to eleventh addresses X<7:11> to output addresses PMS<0:10>. The addresses PMS<0:10> only change their forms from the seventh to eleventh addresses X<7:11>, but are also similar to the seventh to eleventh address addresses X<7:11>. Although not shown, addresses other than the addresses PMS<0:10> are also inputted to each of the cell blocks 120 to 220.

The addresses outputted form the pre-decoder 110 and the other addresses not shown herein are inputted to each of the cell blocks 120 to 220, and control a main word line driving unit 121, a phi X driving unit 124, a sub word line driving unit 127, and the like to drive a specific word line selected by the address.

FIG. 2 is a mapping table illustrating the mapping relationship between the cell blocks and the addresses X<7:11>. The cell blocks are respectively selected by combinations of the addresses as illustrated in FIG. 2. Since one of the eleven cell blocks is selected using five addresses, some cell blocks, e.g., the zeroth to ninth cell blocks, are selected by three combinations of the five addresses, and other cell blocks, e.g., the tenth cell block, is selected by two combinations of the five addresses.

FIGS. 3 to 6 are circuit diagrams exemplarily illustrating how addresses are decoded in the pre-decoder 110 shown in FIG. 1.

Referring to FIG. 3, a reference symbol 'BXA7' indicates a seventh address, and a reference symbol 'BXA8' indicates an eighth address. A reference symbol 'AXI<70>' is a signal having a value of '1' when both the seventh and eighth addresses BXA7 and BXA8 have values of '0', and a reference symbol 'AXI<73>' is a signal having a value of '1' when both seventh and eighth addresses BXA7 and BXA8 have values of '1'. Likewise, although not shown, a reference symbol 'AXI<71>' is a signal having a value of '1' when the seventh address BXA7 has a value of '1' and the eighth address BXA8 has a value of '0', and a reference symbol 'AXI<72>' is a signal having a value of '1' when the seventh address BXA7 has a value of '0' and the eighth address BXA8 has a value of '1'. A reference symbol 'BXA8B' indicates merely an inverted signal of the eighth address BXA8, a reference symbol 'AXBI<70>' indicates merely an inverted signal of the signal AXI<70>, and a reference symbol 'AXBI<73>' indicates merely an inverted signal of the signal AXI<73>.

That is, the addresses AXI<70>, BXA8B and AXI<73> are obtained by pre-decoding the respective addresses. The addresses AXI<XX>, which are pre-decoded in this manner, are used in various kinds of blocks, which will be described later.

Referring to FIG. 4, ninth to eleventh addresses BXA9, BXA10 and BXA11 are pre-decoded to generate addresses MMS<0:7>. The addresses MMS<0:7> are binary codes obtained by transforming the ninth to eleventh addresses BXA9, BXA10 and BXA11 into binary numbers. When all the ninth to eleventh addresses BXA9, BXA10 and BXA11 have values of '0', the address MMS<0> has a value of '1'; and when all the ninth to eleventh addresses BXA9, BXA10 and BXA11 have values of '1', the address MMS<7> has a value of '1'. The addresses MMS<0:7> change their forms from the addresses BXA9, BXA10 and BXA11, but they are also addresses, which will be used in various kinds of blocks to be described later.

Referring to FIG. 5, it can be seen that addresses PMS<0:3> are generated through decoding the pre-decoded addresses MMS<X> and AXBI<X>. Each of the addresses PMS<0:3> is a signal activated when each of the cell blocks <0:3> is selected. This can be understood from the addresses used to generate the addresses PMS<0:3> and the mapping table of FIG. 2. Although not shown, addresses PMS<4:7> may be generated in the same manner as the addresses PMS<0:3>. A reference symbol 'R3DI' indicates a signal used in a test mode for testing a redundancy cell, and is fixed to a value of '1' during a normal operation.

Referring to FIG. 6, it can be seen that addresses PMS<8:10> are generated by decoding the address MMS<X> and the address AXBI<X>. The addresses PMS<8:10> are activated when each of the cell blocks <8:10> is selected, which can be understood from the mapping table of FIG. 2.

FIGS. 7 and 8 are circuit diagrams of the main word line driving unit 121 shown in FIG. 1. FIG. 7 illustrates a portion of the main word line driving unit 121 receiving addresses. To be specific, FIG. 7 illustrates the portion of the main word line driving unit 121 provided in the zeroth cell block 120, and therefore, the main word line driving unit 121 is enabled by the address PMS<0>. This is because the address PMS<0> is activated when the zeroth cell block 120 is selected.

That is, the circuit of FIG. 7 generates signals MWDI<60:65> which are activated to logic 'low' according to which address is activated among the addresses AXI<60:65> during an activation of the address PMS<0>. The addresses AXI<60:65> are obtained by decoding the sixth to eighth addresses BXA6, BXA7 and BXA8. The circuit of FIG. 7 is provided in plurality in the main word line driving unit 121 depending on the number of word lines to be driven.

FIG. 8 illustrates another portion of the main word line driving unit 121 for driving a zeroth main word line MWLB<0> based on the combination of the signal MWDI<60> and the address AXI<30>. When the address AXI<30>, which is achieved based on the combination of third to fifth addresses, is activated to logic 'high' in a state that the signal MWDI<60> is activated to logic 'low', the zeroth main word line MWLB<0> is enabled to logic 'low'. The other main word lines, i.e., main word lines other than the zeroth main word line MWLB<0>, are also enabled based on the combination of the respective addresses in the same manner as the zeroth main word line MWLB<0>. A reference symbol 'WPHMW' indicates a control signal of the main word line driving unit 121, which is irrespective of a procedure of selecting the word line.

FIGS. 9 and 10 are circuit diagrams of the phi X driving unit 124 shown in FIG. 1. FIG. 9 illustrates a portion of the phi X driving unit 124 receiving addresses. Similarly to the main word line driving unit 121, the phi X driving unit 124 is also enabled based on the address PMS<0> because the phi X driving unit 124 is also provided in the zeroth cell block 120. The phi X driving unit 124 generates a signal FXD20 and a signal FXD21 which are activated to logic 'low' based on the combination of the addresses AXI<20:21> that are obtained based on the combination of the second to fourth addresses.

FIG. 10 illustrates another portion of the phi X driving unit 124 generating a zeroth phi X control signal FXB<0>. The zeroth phi X control signal FXB<0> is activated to logic 'low' when the zeroth address AXI<0> has a value of '1' in a state that the signal FXD20 generated in the portion of the phi X driving unit 124 in FIG. 9 is activated to logic 'low'. The other phi X control signals are also activated in the same manner as the zeroth phi X control signal FXB<0> based on the combination of the respective addresses. A reference symbol 'WPHFX' indicates a control signal of the phi X driving unit 124, which is irrespective of a procedure of selecting the word line.

FIG. 11 is a circuit diagram of the sub word line driving unit 127 shown in FIG. 1. To be specific, FIG. 11 illustrates a portion of the sub word line driving unit 127, which drives zeroth, second, fourth, sixth, eighth, tenth, twelfth and fourteenth sub word lines SWL0, SWL2, SWL4, SWL6, SWL8, SWL10 and SWL12 controlled by the zeroth main word line MWLB0. Each sub word line SWL is enabled to logic 'high' when the corresponding main word line MWLB and the corresponding phi X control signal FXB are activated to logic 'low'.

If the number of word lines provided in each cell block is not a power of 2, the addresses and the word lines do not correspond to each other one-to-one. Therefore, some addresses should perform selecting the word line in the cell block and selecting the cell block concurrently.

A plurality of control circuits controlling a decoder are required to perform the sequential selection operation because the selection of the word line in the cell block and the selection of the cell block are performed concurrently. This causes the main word driving unit, the phi X driving unit, and so forth to have complex configurations.

In particular, the signal PMS<0:10> for selecting the cell block can be produced after passing through a plurality of decoding terminals, leading to a delay during this procedure. After the generation of the signal PMS<0:10> selecting the cell block, a subsequent decoding operation (word line selecting operation) is performed to select the word line of the cell block in a state that the word line driving unit and the phi X driving unit in the cell block are enabled by the generated signal PMS<0:10>. Therefore, the time delay increases. If the time taken for the word line to be selected and enabled increases as above, there is a problem that a sensing margin of a sense amplifier and AC characteristic (e.g., tRCD and tRP) may be deteriorated.

Moreover, a total area for circuits for decoding the word line is large, which leads to an increase in current consumption and layout area.

SUMMARY OF THE INVENTION

Embodiments of the present invention are directed to providing a semiconductor memory device and a word line driving method thereof, which can reduce a delay time taken to select a word line and also reduce a total area of a decoding circuit by selecting a cell block and the word line using a simple decoding method.

Embodiments of the present invention are directed to providing a semiconductor memory device and a word line driving method thereof, which can improve AC characteristic by reducing a time taken for selecting a word line to the maximum even if the number of the word lines provided in each cell block is not a power of 2.

In accordance with an aspect of the present invention, there is provided a semiconductor memory device including a plurality of cell blocks, which includes: a block decoding unit configured to decode an address for selecting a corresponding cell block to generate a block selection signal; a block information address generating unit configured to perform a logic operation on the block selection signal and an assignment address for selecting a word line to be activated within the corresponding cell block to generate a block information address activated only when the corresponding cell block is selected; and a word line driving unit configured to select a word line in response to the block information address.

In accordance with another aspect of the present invention, there is provided a word line driving method of a semiconductor memory device, the method including: decoding an input address for selecting a cell block to generate a block selection signal that is activated when a corresponding cell block is selected; performing a logic operation on the block selection signal and an assignment address for selecting a word line to be activated within the corresponding cell block to generate a block information address activated only when the block selection signal is activated; and driving a word line in each cell block in response to the block information address.

BRIEF DESCRIPTION OF THE DRAWINGS

FIG. 2 is a mapping table illustrating a mapping relation between cell blocks and addresses (X<7:11>).

FIGS. 3 to 6 are circuit diagrams exemplarily illustrating how addresses are decoded in a pre-decoder shown in FIG. 1.

FIGS. 7 and 8 are circuit diagrams of a main word line driving unit shown in FIG. 1.

DESCRIPTION OF SPECIFIC EMBODIMENTS

Other objects and advantages of the present invention can be understood by the following description, and become apparent with reference to the embodiments of the present invention.

Herebelow, a semiconductor memory device including 384 word lines in each cell block will be exemplarily illustrated. However, the essence of present invention is to simplify a selecting operation of a word line by allowing an address used to select a word line in a cell block to contain cell block selection information as well. Therefore, it is obvious that the essence of the present invention is also applicable to a variety of semiconductor memory devices.

Figure 1:
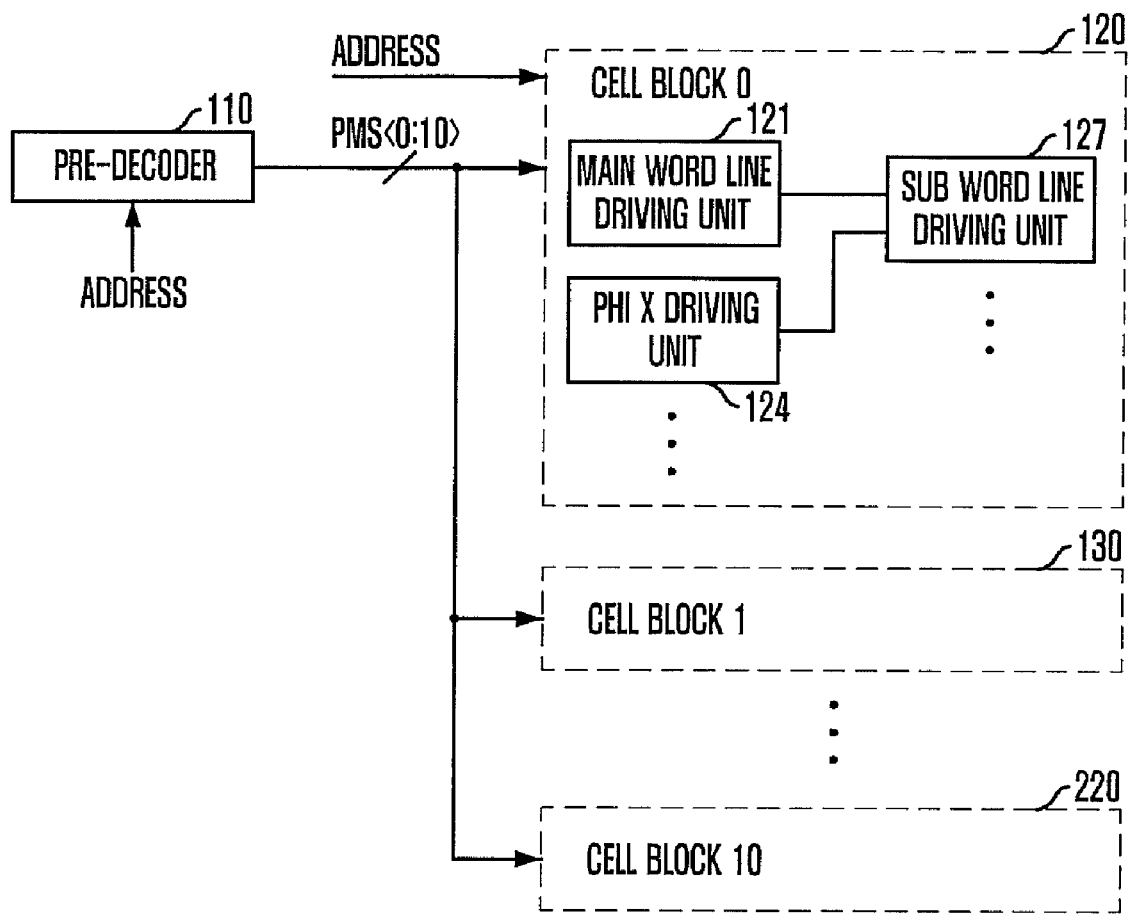
FIG. 1 is a block diagram of a conventional semiconductor memory device having a circuit configuration for selecting a word line by decoding an address.
Figure 4:
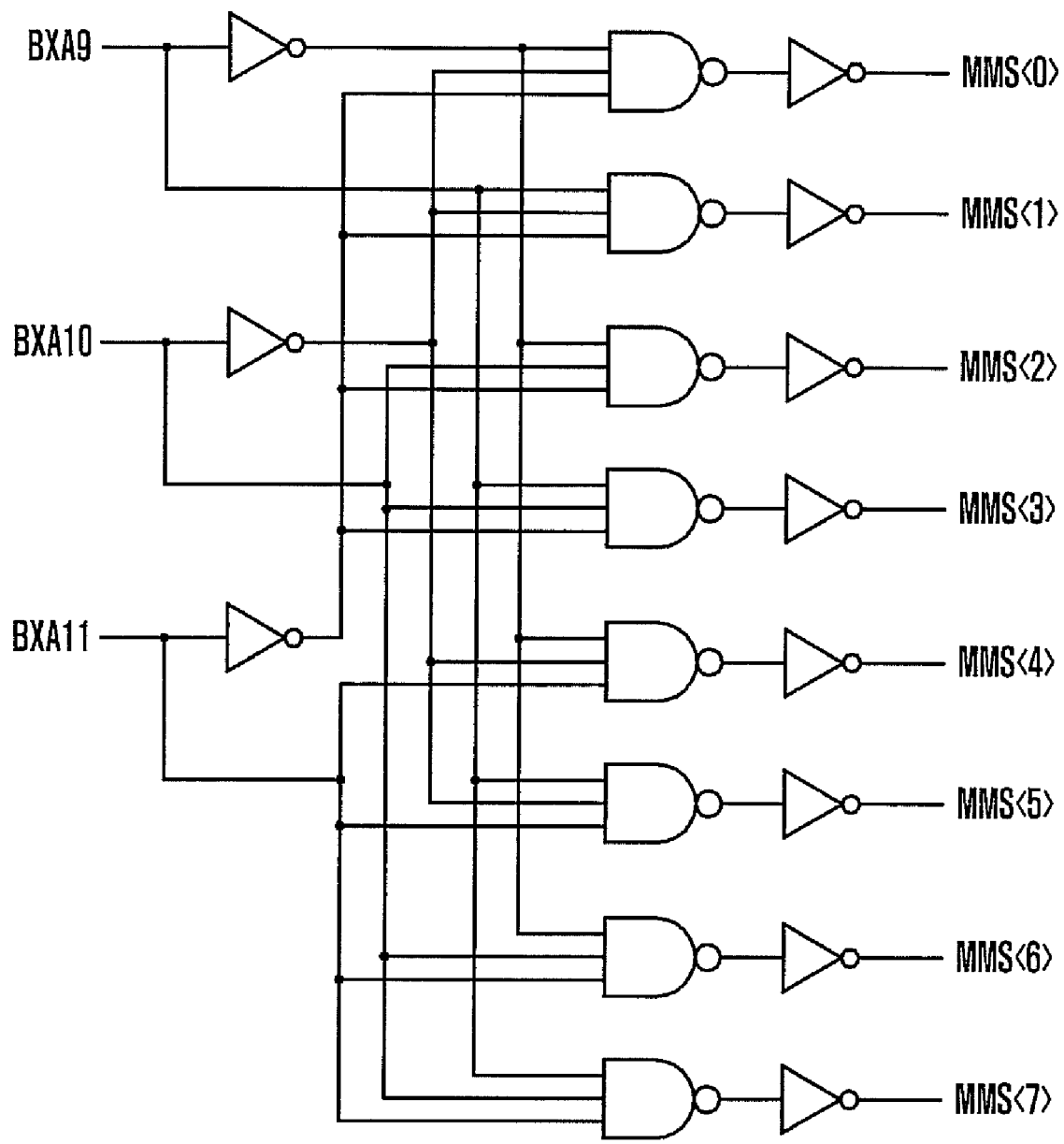
Figure 5:
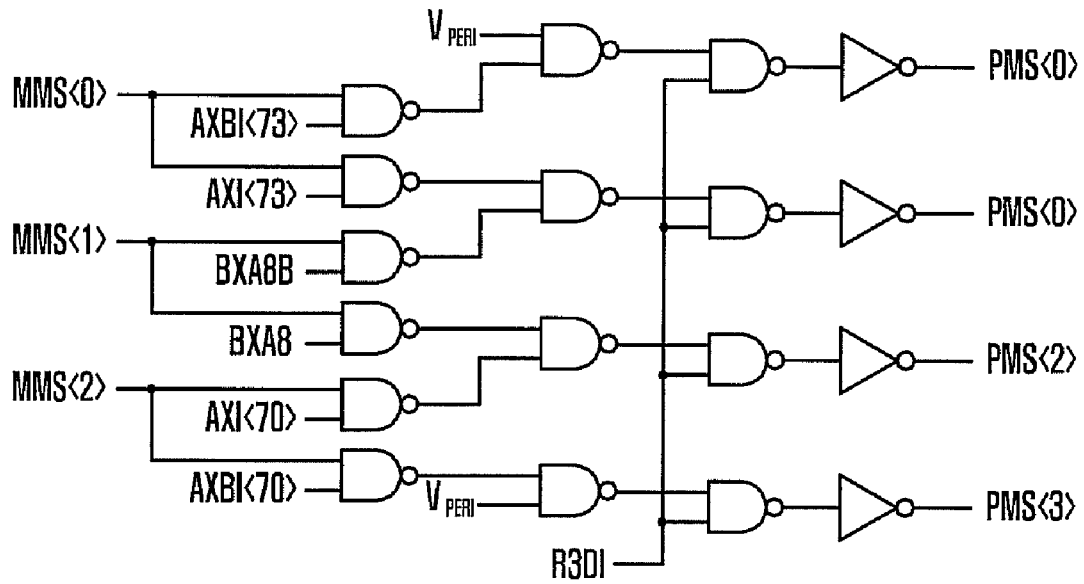
Figure 6:
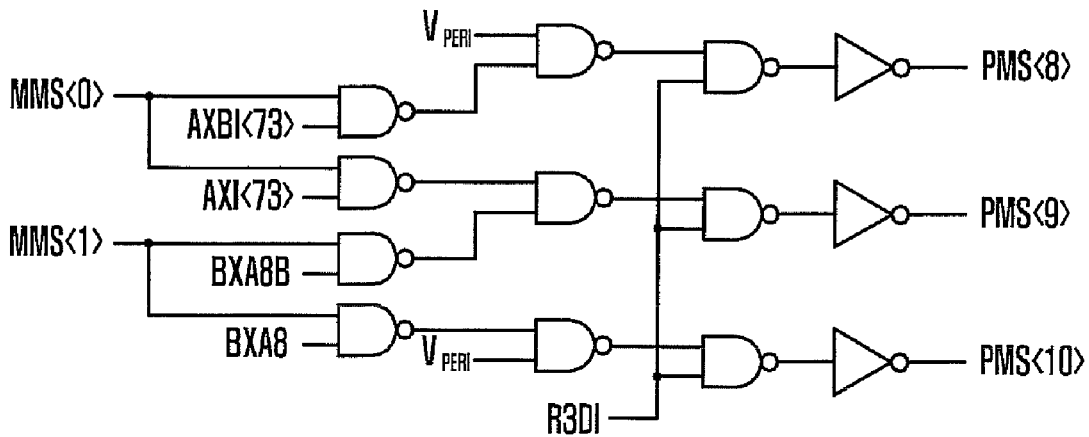
Figure 8:
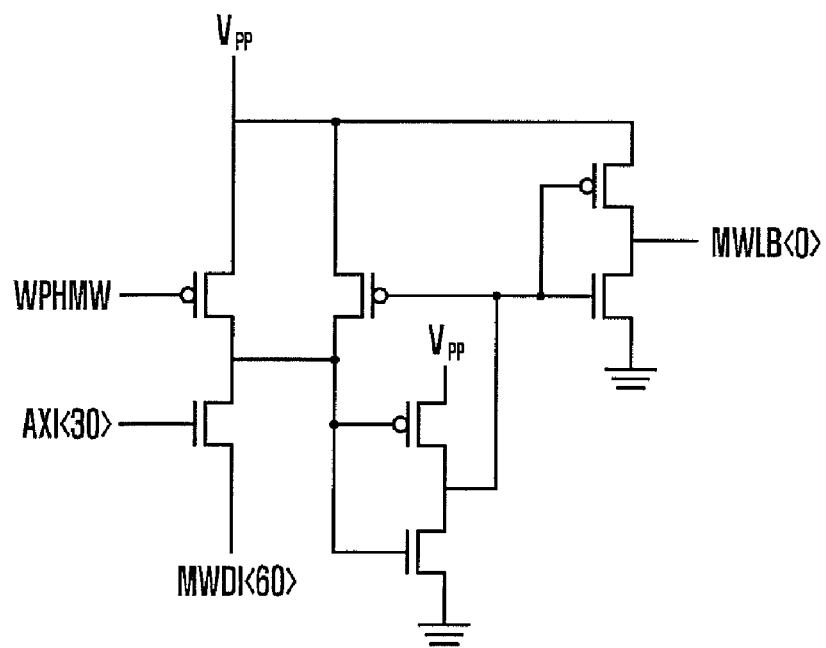
Figure 9:
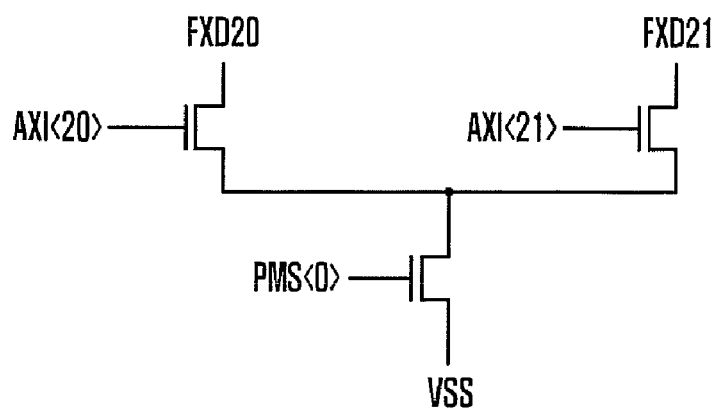
FIGS. 9 and 10 are circuit diagrams of a phi X driving unit shown in FIG. 1.
Figure 10:
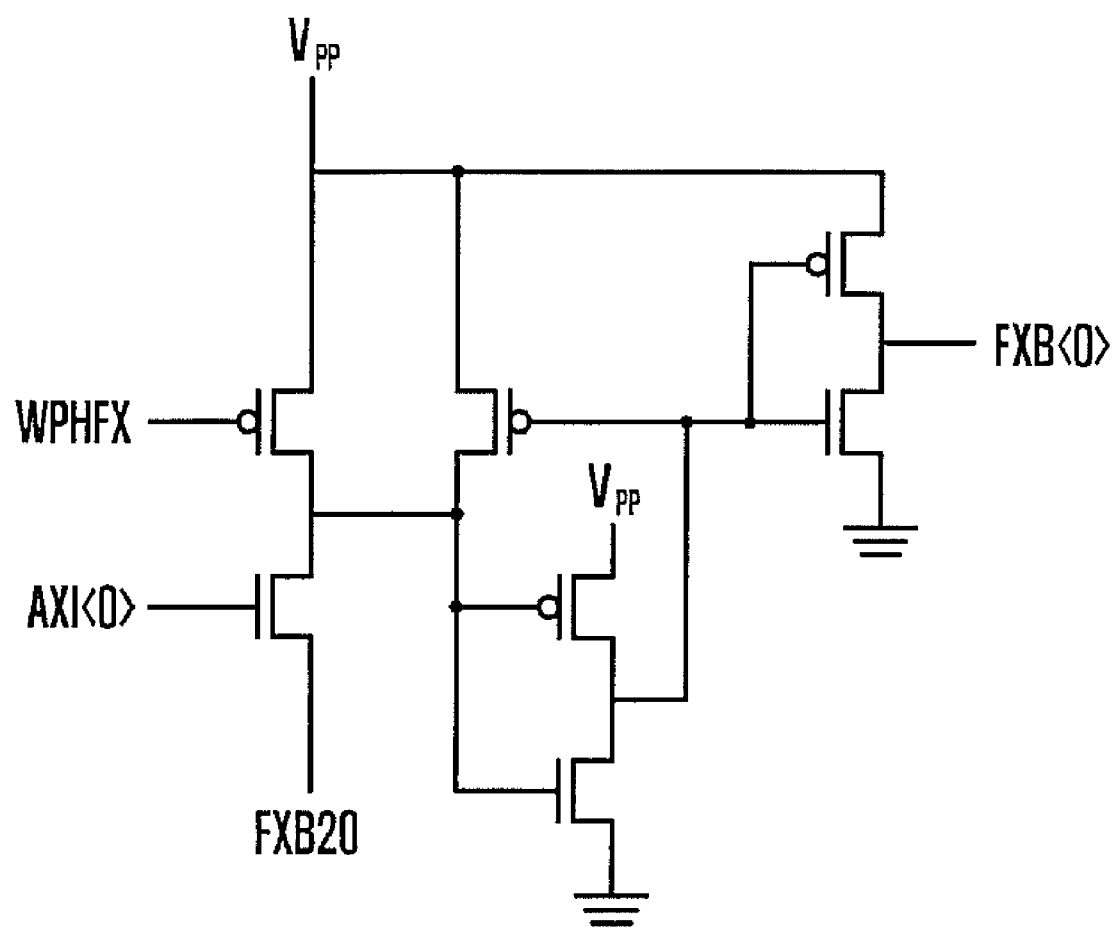
Figure 11:
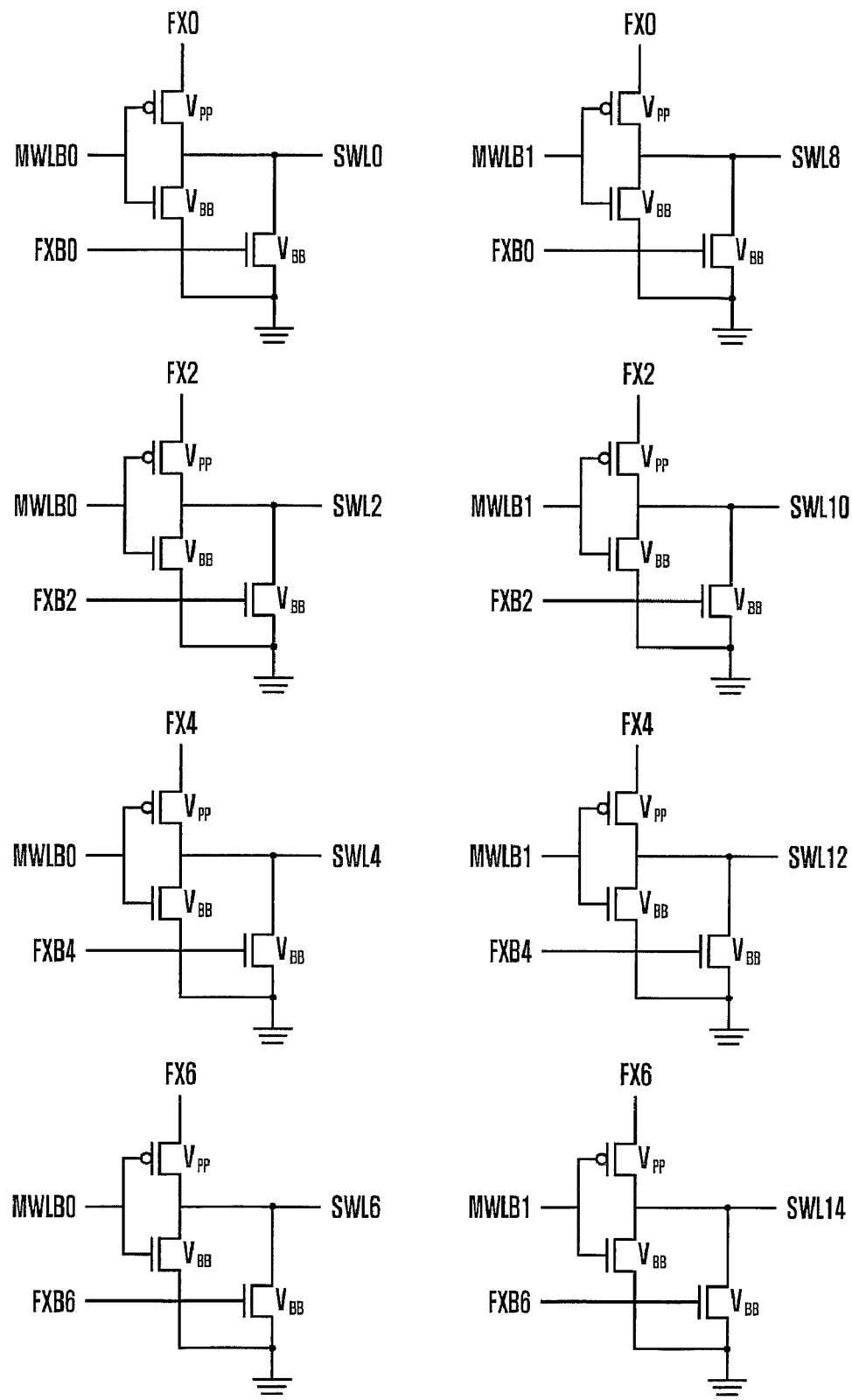
FIG. 11 is a circuit diagram of a sub word line driving unit shown in FIG. 1.
Figure 12:
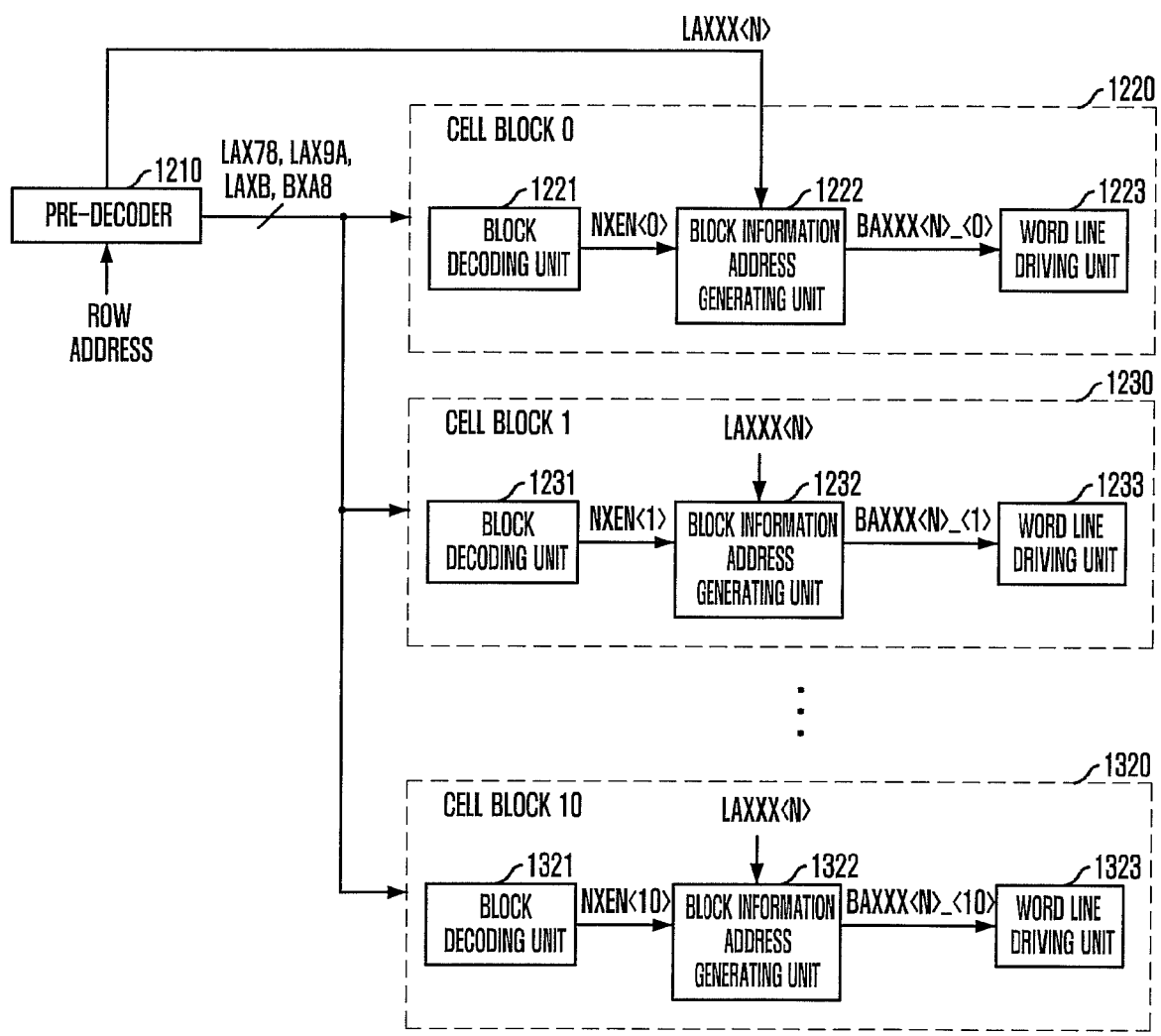
FIG. 12 is a block diagram of a semiconductor memory device in accordance with an embodiment of the present invention.

FIG. 12 is a block diagram of a semiconductor memory device in accordance with an embodiment of the pre sent invention.

Referring to FIG. 12, the semiconductor memory device in accordance with the embodiment of the present invention includes block decoding units 1221 to 1321, block information address generating units 1222 to 1322, and word line driving units 1223 to 1323, which respectively correspond to cell blocks 1220 to 1320.

The block decoding units 1221 to 1321 generate block selection signals NXEN<0:10> by decoding addresses LAX9A, LAXB, LAX78 and BXA8 used to select the corresponding cell blocks 1220 to 1320. The block decoding unit 1221 corresponds to the zeroth cell block 1220, and generates a block selection signal NXEN<0> by decoding the addresses LAX9A, LAXB, LAX78 and BXA8 used to select the zeroth cell block 1220. The block selection signal NXEN<0> is activated when the zeroth cell block 1220 is selected. Herein, subscripts following the name of the address LAX9A, LAXB, LAX78, BXA8 will be specifically described later. Likewise, the block decoding unit 1231 corresponds to the first cell block 1230, and generates a block selection signal NXEN<1> that is activated when the first cell block 1230 is selected.

The block information address generating units 1222 to 1322 perform a logic operation on the block selection signal NXEN<0:10> and an address LAXXX<N> to thereby generate block information addresses BAXXX<N>_<0:10> that is activated only when the corresponding cell block is selected. The address LAXXX is a signal for selecting a word line in the corresponding cell block. The block information addresses BAXXX<N>_<0:10> have an original address value only if corresponding one of the block selection signal NXEW<0:10> is activated; and if not, it always has a value of '0'. For example, the block information address BAXXX<N>_<0> outputted from the block information address generating unit 1222 has the same value as the address only when the block selection signal NXEN<0> is activated. However, the block information address BAXXX<N>_<0> always has a value of '0' when the block selection signal NXEN<0> is inactivated.

Each word line driving unit 1223 to 1323 selects a word line using corresponding one of the block information addresses BAXXX<N>_<0:10>. The block information addresses BAXXX<N>_<0:10> include information about the corresponding cell blocks 1220 to 1320 that the word line to be driven belongs to. Accordingly, by using the block information addresses BAXXX<N>_<0:10>, the word line driving units 1223 to 1323 can detect whether the corresponding cell block is selected or not, and also to detect the word line to be driven. The word line driving units 1223 to 1323 may use not only the block information addresses BAXXX<N>_<0:10> but also a normal address such as LAX together with the block information addresses BAXXX<N>_<0:10>. As similar to the configuration of the conventional word line driving unit, the word line driving units 1223 to 1323 may include a main word line driving unit, a phi X driving unit and a sub word line driving unit.

The pre-decoder 1210 pre-decodes an address ROW_ADDRESS to transfer the pre-decoded address to the corresponding cell blocks 1220 to 1320. The address, e.g., LAX or BAX, outputted from the pre-decoder 1210 changes its form from the address ROW_ADDRESS inputted to the pre-decoder 1210. This will be described in detail with reference to the accompanying drawings later.

Unlike the conventional semiconductor memory device, signals for selecting the cell blocks 1220 to 1320 and addresses for selecting the world lines in the cell blocks 1220 to 1320 are not separately used, but the cell blocks 1220 to 1320 and the word lines are selected by the same block information addresses BAXXX<N>_<0:10> including information for selecting the cell blocks 1220 to 1320 and the word lines in the cell blocks 1220 to 1320. Therefore, the selection of the cell blocks 1220 to 1320 and the selection of the word lines are simultaneously performed. This makes it unnecessary to consider both a timing margin for selecting the cell blocks 1220 to 1320 and a timing margin for selecting the word lines because the cell blocks 1220 to 1320 and the word lines are selected at the same time. As a result, a delay time taken for the word line to be selected can be reduced, improving AC characteristic of a memory device.

Since each of the cell blocks 1220 to 1320 includes the corresponding block decoding unit 1221 to 1321 and the corresponding block information address generating unit 1222 to 1322, a total area of the memory device can be reduced when these circuits are disposed at regions where row-based circuits and column-based circuits cross each other. Herein, the block decoding units 1221 to 1321 have the same configuration but receive different input signals, and also the block information address generating units 1222 to 1322 have the same configuration but receive different input signals.

In the conventional semiconductor memory device, all the selection signals of the cell blocks are produced by the pre-decoder and circuits for decoding the selection signals of all the cell blocks should require large areas. Therefore, it is difficult to separately arrange the circuits for selecting the cell blocks in each of the cell blocks. In the semiconductor memory device of the present invention, however, the circuits for selecting the cell blocks can be separately disposed in each of the cell blocks 1220 to 1320 because the block decoding units 1221 to 1321, and the block information address generating units 1222 to 1322 are provided in each of the cell blocks 1220 to 1320.

Figure 13:
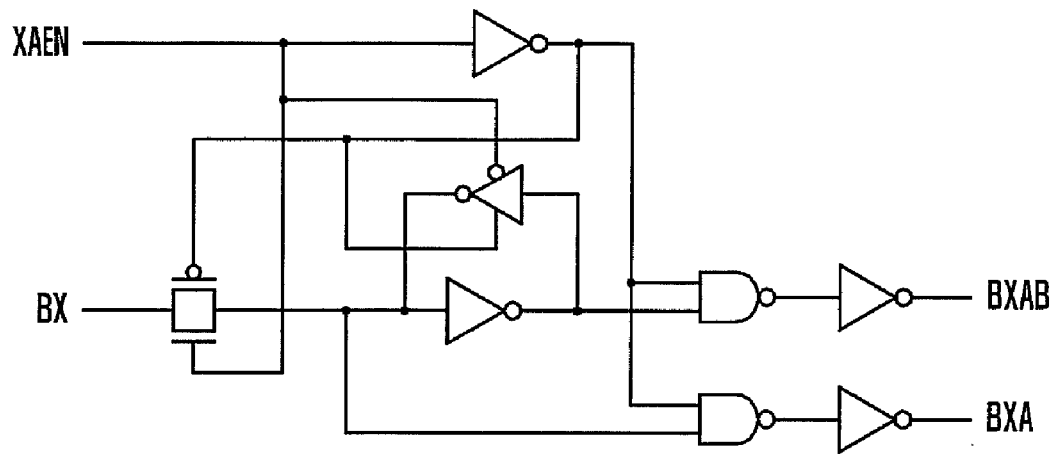
FIGS. 13 and 14 are circuit diagrams of circuits included in a pre-decoder shown in FIG. 12.
Figure 14:
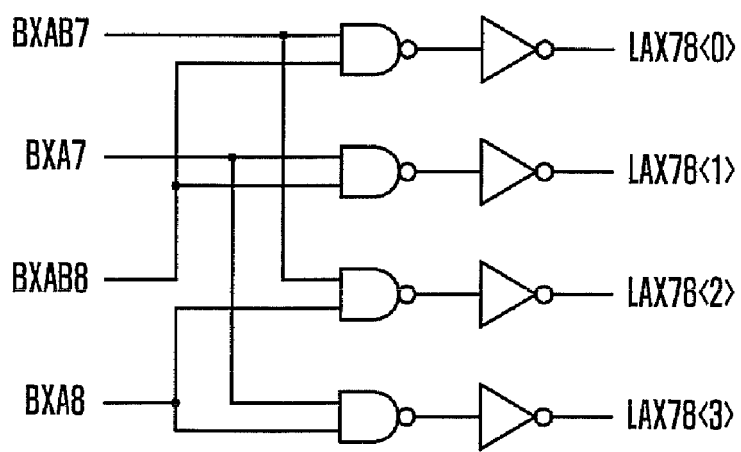

FIGS. 13 and 14 are circuit diagrams of circuits included in the pre-decoder 1210 shown in FIG. 12.

Referring to FIG. 13, an address BX is latched by a row address enable signal XAEN, and then outputted as an address BXA. It means that a new address may be inputted only while the row address enable signal XAEN is activated.

The circuit of FIG. 13 is provided for each address. That is, the circuit of FIG. 13 is provided to receive respective addresses, e.g., zeroth address or first address. However, for general illustration, a specific address number is not given to the addresses BX and BXA in FIG. 13.

Referring to FIG. 14, it can be seen that addresses LAX78<0:3> are generated by decoding seventh and eighth addresses BXA7 and BXA8. Here, in the reference symbol 'LAX78<0:3>', '78' means that this address has information of the seventh address BXA7 and information of the eighth address BXA8, and '<0:3>' means values of binary codes obtained by transforming the seventh and eighth addresses BXA7 and BXA8 into a binary number. For instance, if both the seventh and eighth addresses BXA7 and BXA8 have values of '0', the address LAX78<0> has a value of '1'; and if both the seventh and eighth addresses BXA7 and BXA8 have values of '1', the address LAX78<3> has a value of '1'.

Figure 15:
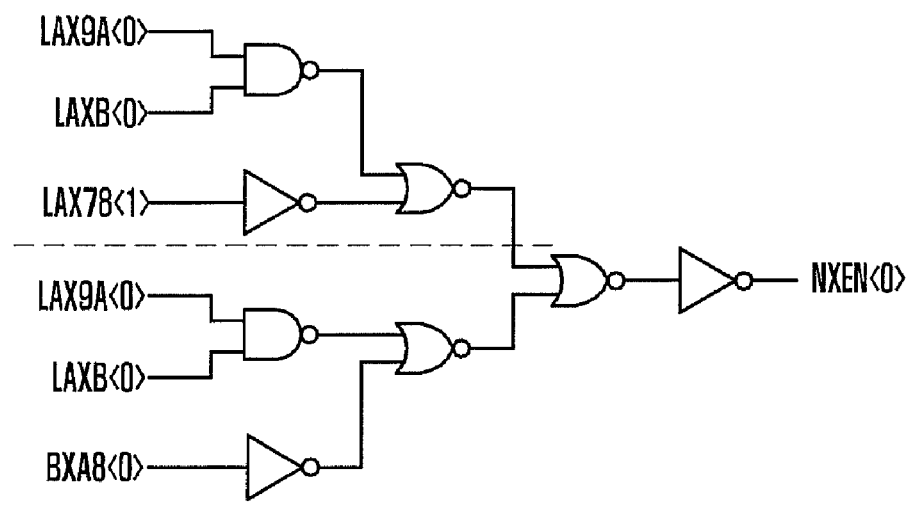
FIG. 15 is a circuit diagram of a block decoding unit shown in FIG. 12.

FIG. 15 is a circuit diagram of the block decoding unit 1221 shown in FIG. 12. The block decoding unit 1221 decodes the address for selecting the cell block 1220 to generate the block selection signal NXEN<0> activated when the cell block 1220 is selected.

The block decoding unit of FIG. 15 corresponds to the block decoding unit 1221 included in the zeroth cell block 1220, and is configured in such a manner that the block selection signal NXEN<0> is activated when the combination of addresses for selecting the zeroth cell block 1220 is inputted. How each of the cell blocks 1220 to 1320 is selected by the combination of addresses has been already described in the mapping table of FIG. 2.

From the mapping table of FIG. 2, two of three values of the eighth address X<8> are the same in the combination of addresses for selecting each of the cell blocks 1220 to 1320. For example, two of three values of the eighth address X<8> are '0' in the combination of addresses for selecting the zeroth cell block, and two of three values of the eighth address X<8> are '1' in the combination of addresses for selecting the second cell block.

When the eighth address X<8> has the above-described value, values of the ninth, tenth and eleventh addresses X<9:11> are not changed. For example, if two of the three values of the eighth address X<8> for selecting the zeroth cell block are '0', the ninth, tenth and eleventh addresses X<9:11> have values of '0', '0', and '0', respectively. Likewise, if two of the three values of the eighth address X<8> for selecting the second cell block are '1', the ninth, tenth and eleventh addresses X<9"11> have values of '1', '0', and '0', respectively.

Addresses below a dotted line of FIG. 15 are inputted to select the cell block in this case. For example, when the eighth address X<8> has a value of '0' and the ninth, tenth and eleventh addresses X<9:11> have values of '0', '0', and '0', respectively, the zeroth cell block is always selected regardless of a value of another address. Therefore, as illustrated in FIG. 15, when the address LAX9A<0>, the address LAXB<0> and the address BXA8<0> inputted to a circuit shown below the dotted line of FIG. 15 have values of '1', the block selection signal NXEN<0> has a value of '1'. Here, the address LAX9A<0> is generated based on the combination of ninth and tenth addresses, and the address LAXB<0> means the eleventh address.

Addresses above the dotted line of FIG. 15 are inputted to select the cell block in the case where the eighth address X<8> has a value different from the above. For example, when the eighth address X<8> has a value of '1', the zeroth cell block can be selected only if the seventh address X<7> has a value of '0', and the ninth, tenth and eleventh addresses X<9:11> have values of '0', '0', and '0', respectively. Accordingly, the circuit is configured such that the block selection signal NXEN<0> has a value of '1' when all the addresses LAX9A<0>, LAXB<0> and LAX78<1> above the dotted line of FIG. 15 have a value of '1'.

Likewise, if a circuit is designed to generate the block selection signal NXEN<1> selecting the first cell block, the addresses LAX9A<0>, LAXB<0>, LAX78<3>, LAX9A<1>, LAXB<0> and BXA8<0> are inputted from an upper part to a lower part in FIG. 15. Also, if a circuit is designed to generate a block selection signal NXEN<5> selecting the fifth cell block, the addresses LAX9A<3>, LAXB<0>, LAX78<3>, LAX9A<0>, LAXB<1> and BXA8<0> are inputted from the upper part to the lower part in FIG. 15.

A person of ordinary skill in the art can design addresses required for selecting the respective cell blocks 1220 to 1320 with reference to FIGS. 2 and 15, and thus further description for it will be omitted herein.

Figure 16:
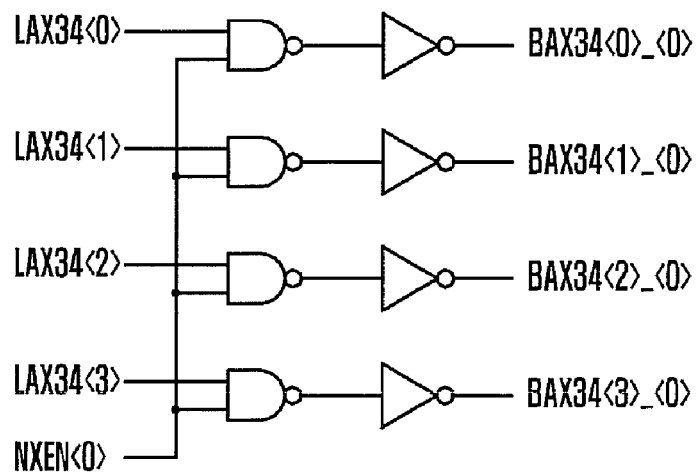
FIG. 16 is a circuit diagram of a block information address generating unit shown in FIG. 12.

FIG. 16 is a circuit diagram of the block information address generating unit 1222 shown in FIG. 12.

Referring to FIG. 16, the block information address generating unit 1222 generates block information addresses BAX34<0:3>_<0> by combining the address LAX34<0:3> and the block selection signal NXEN<0> activated when the cell block 1220 is selected.

The block information address generating unit shown in FIG. 16 is the block information address generating unit 1222 corresponding to the zeroth cell block 1220, it has a configuration to receive the combination of the block selection signal NXEN<0> and the addresses LAX34<0:3>. If the block information address generating unit belongs to other cell blocks 1230 to 1320, it uses the block selection signal NXEN<N> for selecting other cell blocks 1230 to 1320.

As for operation, when the block selection signal NXEN<0> is activated, that is, when the zeroth cell block 1220 is selected, the addresses LAX34<0:3> and the block information addresses BAX34<0:3>_<0> have the same value. However, when the block selection signal NXEN<0> is inactivated, that is, when the zeroth cell block 1220 is unselected, the block information addresses BAX34<0:3>_<0> must have a value of '0'.

If the block information address generating unit belongs to the fifth cell block, it performs a logic operation on the addresses LAX34<0:3> and the block selection signal NXEN<5> to generate block information addresses BAX34<0:3>_<5>. While FIG. 16 illustrates a case that the address BAX34 is generated using the address LAX34 having information of third and fourth addresses, the principle of generating the address BAX56 using LAX56 and generating the address BAX78 using LAX78 is the same as the above.

Figure 17:
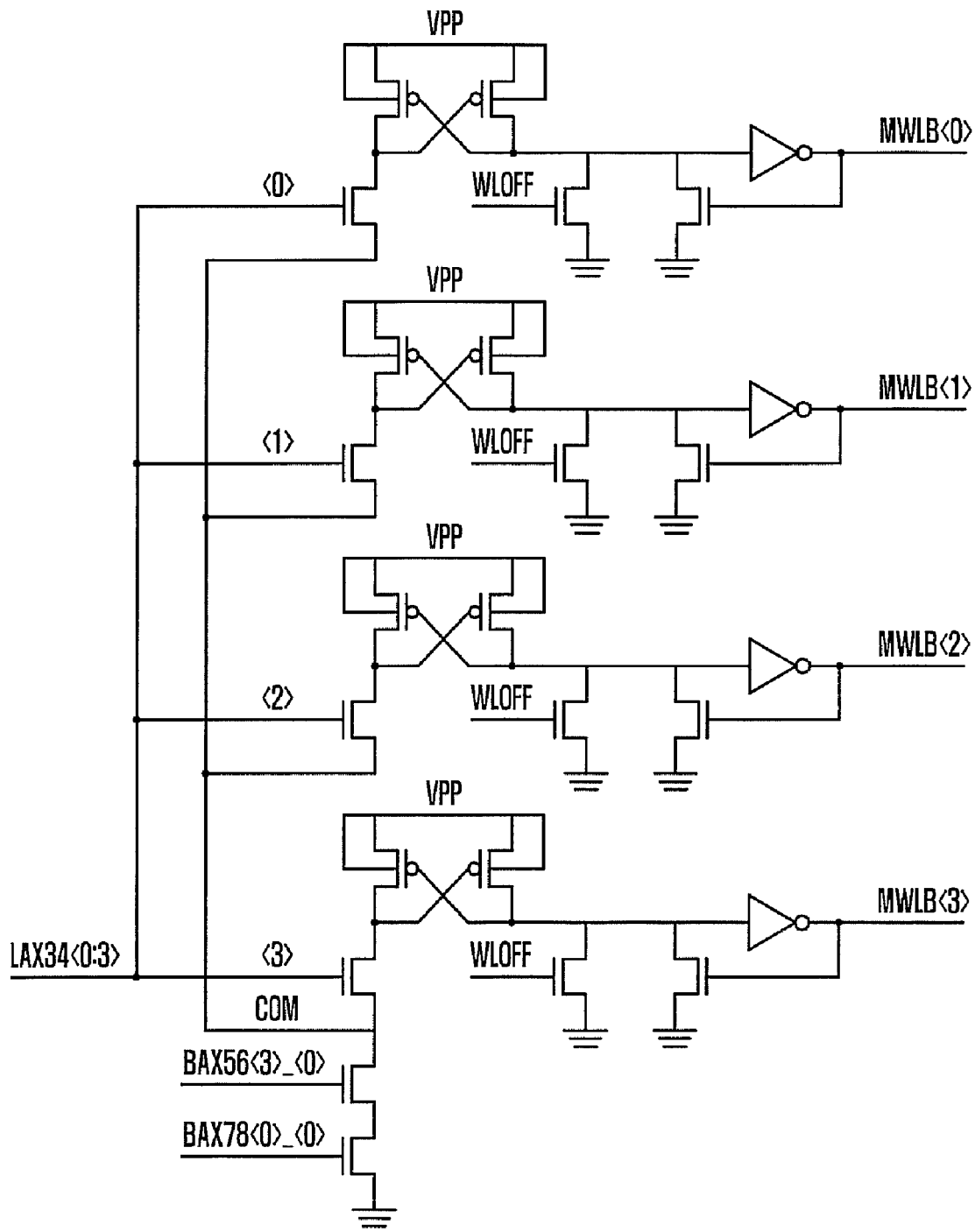
FIGS. 17 to 19 are circuit diagrams of circuits included in a word line driving unit shown in FIG. 12.
Figure 18:
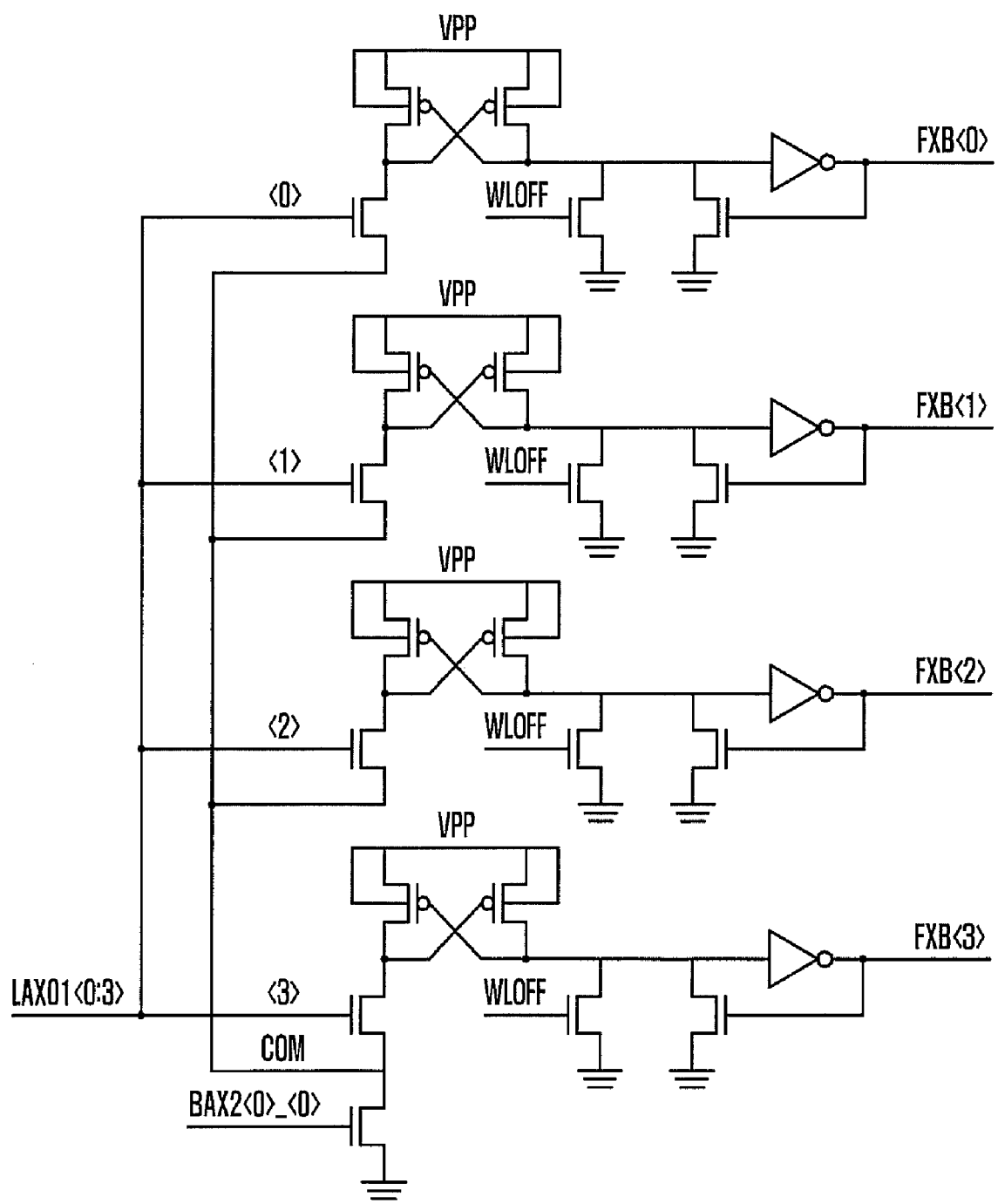
Figure 19:
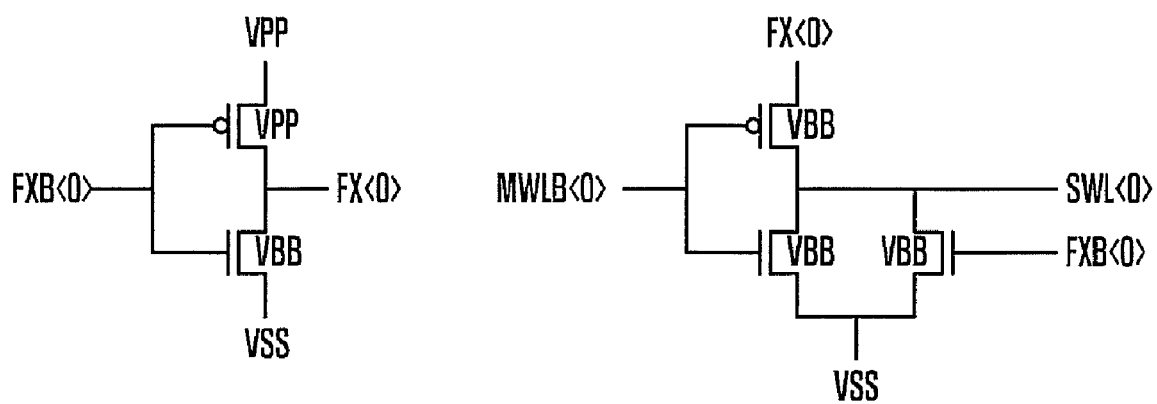

FIGS. 17 to 19 are circuit diagrams of the word line driving unit 1223 shown in FIG. 12. FIG. 17 is a circuit diagram of a main word line driving unit, FIG. 18 is a circuit diagram of a phi X driving unit, and FIG. 19 is a circuit diagram of a sub word line driving unit.

FIG. 17 illustrates a portion of the main word line driving unit. The other portion of the main word line driving unit, which is not shown herein, has the same configuration as that of the circuit of FIG. 17, except for the block address BAX and the address LAX. The main word line driving unit drives main word lines MWLB<0:3> in response to the block information addresses BAX56<3>_<0> and BAX78<0>_<0> and the addresses LAX34<0:3>.

As described above, the block information addresses BAX56<3>_<0> and BAX78<0>_<0> always have values of '0' if the zeroth cell block is not selected. Therefore, if the zeroth cell block is not selected, the main word line driving unit of FIG. 17 drives no main word lines MWLB<0:3>. However, if the zeroth cell block is selected, one of the main word lines MWLB<0:3> is driven to logic 'low' by only the combination of the fifth, sixth, seventh and eighth addresses BAX56<3>_<0> and BAX78<0>_<0> and the third and fourth addresses LAX34<0:3>.

That is, when the zeroth cell block is not selected, the block information addresses BAX56<3>_<0> and BAX78<0>_<0> do not drive any main word lines MWLB<0:3> in the zeroth cell block, and also functions to select one of the main word lines MWLB<0:3> using address information, e.g., information of fifth, sixth, seventh and eighth addresses.

A signal indicated by a reference symbol 'WLOFF' is used to disable all word lines, and all the main word lines MWLB are disabled to logic 'high' if the signal WLOFF is activated.

FIG. 18 illustrates a portion of the phi X driving unit. The other portion of the phi X driving unit, which is not shown herein, has the same configuration as that of the circuit of FIG. 18, except for the block address BAX and the address LAX. Like the main word line driving unit, the block information address BAX2<0>_<0> has a value of '0' when the zeroth cell block is not selected. Therefore, any phi X control signals FXB<0:3> are not inactivated to logic 'low'. When the zeroth cell block is selected, one of the phi X control signals FXB<0:3> is activated using information of the second address BAX2<0>_<0> and the zeroth and first addresses LAX01<0:3>.

FIG. 19 illustrates a portion of the sub word line driving unit. The other portion of the sub word line driving unit, which is not shown herein, has the same configuration as that of the circuit of FIG. 19, except for the block address BAX and the address LAX.

As for operation, when the phi X control signal FXB<0> is activated to logic 'low' and the main word line MWLB<0> is driven to logic 'low', the sub word line SWL<0>, which actually controls a memory cell, is driven to logic 'high'.

Referring again to FIGS. 12 to 19, a word line driving method of a semiconductor memory device in accordance with the present invention will be described below.

The word line driving method of the semiconductor memory device in accordance with the embodiment of the present invention includes: decoding addresses LAX9A, LAXB, LAX78 and BXA78 for selecting a cell block to generate a block selection signal NXEN<0:10> that is activated when a corresponding cell block is selected; performing a logic operation on the block selection signal NXEN<0:10> and an address LAXXX<N> to generate a block information address BAXXX<N>_<0:10> activated only when the block selection signal NXEN<0:10> is activated; and driving a word line in each cell block using the block information address BAXXX<N>_<0:10>.

As described above, the address LAXXX<N> may be used together with the block information address BAXXX<N>_<0:10> so as to drive word lines. The operation of driving the word lines includes: driving a main word line MWLB<N> using the block information address BAXXX<N>_<0:10>; generating a phi X control signal FXB<N> by using the block information address BAXXX<N>_<0:10>; and driving a sub word line SWL<N> in response to the main word line MWLB<N> and the phi X control signal FXB<N>.

In accordance with the present invention, information about a cell block is included in an address, and a word line and a cell block to be driven are selected using this address.

Therefore, it is possible to reduce a size of a decoding circuit. Accordingly, a total area of a memory device can be reduced, and thus current consumption can be reduced as well.

In addition, it is possible to reduce a delay time taken for a word line to be selected and enabled, thus improving AC character.

Furthermore, since block decoding units having the same configuration are provided in each cell block, these decoding circuits can be disposed at regions where row-based circuits and column-based circuits of the cell block cross each other. Consequently, a total area of the memory device can be reduced through an effective layout.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device including a plurality of cell blocks, comprising:
a block decoding unit configured to decode an input address for selecting a corresponding cell block to generate a block selection signal;
a block information address generating unit configured to perform a logic operation on the block selection signal and an assignment address for selecting a word line to be activated within the corresponding cell block to generate a block information address activated only when the corresponding cell block is selected; and
a word line driving unit configured to select a word line in response to the block information address.

2. The semiconductor memory device of claim 1, wherein the word line driving unit selects the word line by performing a logic operation on the block information address and an address not including block information.

3. The semiconductor memory device of claim 1, wherein the block information address has an original address value only when the block selection signal is activated, and is fixed to a predetermined logic level when the block selection signal is inactivated.

4. The semiconductor memory device of claim 1, wherein the block information address generating unit comprises a NAND gate configured to receive the assignment address and the block selection signal to output the block information address.

5. The semiconductor memory device of claim 1, wherein the word line driving unit is enabled in response to the block information address.

6. The semiconductor memory device of claim 1, wherein the word line driving unit comprises:
a main word line driving unit configured to drive a main word line driving unit based on the block information address;
a phi X driving unit configured to generate a phi X control signal based on the block information address; and
a sub word line driving unit configured to drive a sub word line in response to the main word line and the phi X control signal.

7. The semiconductor memory device of claim 6, wherein the main word line driving unit and the phi X driving unit use an address not including block information other than the block information address.

8. The semiconductor memory device of claim 1, wherein the block decoding unit is disposed at a region where a row-based circuit and a column-based circuit cross each other.

9. The semiconductor memory device of claim 1, wherein the block information address generating unit is disposed at a region where a row-based circuit and a column-based circuit provided in the cell block cross each other.

10. A word line driving method of a semiconductor memory device, the method comprising:
    decoding an input address for selecting a cell block to generate a block selection signal that is activated when a corresponding cell block is selected;
    performing a logic operation on the block selection signal and an assignment address for selecting a word line to be activated within the corresponding cell block to generate a block information address activated only when the block selection signal is activated; and
    driving a word line in each cell block in response to the block information address.

11. The word line driving method of claim 10, wherein driving the word line is performed using an address not including block information other than the block information address.

12. The word line driving method of claim 10, wherein the block information address is fixed to a predetermined logic value when the block selection signal is inactivated.

13. The word line driving method of claim 10, wherein driving the word line comprises:
    driving a main word line based on the block information address;
    generating a phi X control signal based on the block information address; and
    driving a sub word line in response to the main word line and the phi X control signal.

* * * * *